United States Patent
Lin et al.

(10) Patent No.: US 10,622,339 B2
(45) Date of Patent: Apr. 14, 2020

(54) METHODS AND DISPLAY DEVICES FOR MICRO-LED MASS TRANSFER PROCESSES

(71) Applicant: Xiamen Changelight Co. Ltd., Xiamen (CN)

(72) Inventors: Zhiwei Lin, Xiamen (CN); Qunxiong Deng, Xiamen (CN); Kaixuan Chen, Xiamen (CN); Zhijie Ke, Xiamen (CN); Xiangjing Zhuo, Xiamen (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 0 days.

(21) Appl. No.: 16/119,204

(22) Filed: Aug. 31, 2018

(65) Prior Publication Data
US 2020/0013760 A1    Jan. 9, 2020

(30) Foreign Application Priority Data
Jul. 9, 2018  (CN) .......................... 2018 1 0743952

(51) Int. Cl.
*H01L 25/075* (2006.01)
*H01L 33/00* (2010.01)
(Continued)

(52) U.S. Cl.
CPC ...... *H01L 25/0753* (2013.01); *H01L 33/0079* (2013.01); *H01L 33/507* (2013.01);
(Continued)

(58) Field of Classification Search
None
See application file for complete search history.

(56) References Cited

U.S. PATENT DOCUMENTS

| 6,887,650 B2* | 5/2005 | Shimoda ................ B82Y 10/00 430/311 |
| 2004/0128829 A1* | 7/2004 | Kimura ............... H01L 21/6835 29/832 |

(Continued)

FOREIGN PATENT DOCUMENTS

| CN | 1349205 A | 5/2002 |
| CN | 102881799 A | 1/2013 |

(Continued)

OTHER PUBLICATIONS

International Search Report and Written Opinion issued in PCT/IB2018/056686, dated Apr. 10, 2019, 9 pages.

*Primary Examiner* — David E Graybill
(74) *Attorney, Agent, or Firm* — Arch & Lake LLP (57) ABSTRACT

A micro-LED macro transfer method, a micro-LED display device, and a method for fabricating the same are provided. In the micro-LED macro transfer method, the LED chips on an array are divided into a first plurality of LED chips and a second plurality of LED chips. An LED chip includes a first surface and a second surface. The first plurality of LED chips are configured so that their first surfaces are coupled to the first transfer substrate. The second plurality of LED chips are configured so that their second surfaces are coupled to the second transfer substrate. Accordingly, the first transfer substrate transfers the first plurality of LED chips to the first transfer substrate while the second transfer substrate transfers the second plurality of LED chips to the second transfer substrate.

19 Claims, 10 Drawing Sheets

(51) Int. Cl.
*H01L 33/56* (2010.01)
*H01L 33/50* (2010.01)
*H01L 33/38* (2010.01)

(52) U.S. Cl.
CPC ............ *H01L 33/56* (2013.01); *H01L 33/382* (2013.01); *H01L 2933/005* (2013.01); *H01L 2933/0041* (2013.01)

(56) References Cited

U.S. PATENT DOCUMENTS

| | | | |
|---|---|---|---|
| 2005/0233504 A1* | 10/2005 | Doi | H01L 21/6835 438/127 |
| 2011/0151588 A1* | 6/2011 | Ashdown | H01L 21/6835 438/3 |
| 2018/0151804 A1* | 5/2018 | Chaji | H01L 51/0024 |
| 2018/0166429 A1* | 6/2018 | Chong | H01L 25/167 |
| 2019/0181317 A1* | 6/2019 | Yu | H01L 33/62 |
| 2019/0221709 A1* | 7/2019 | Lin | H01L 33/145 |

FOREIGN PATENT DOCUMENTS

| | | | | |
|---|---|---|---|---|
| CN | 104134724 A | | 11/2014 | |
| CN | 106206865 A | | 12/2016 | |
| CN | 107017319 A | | 8/2017 | |
| CN | 107068825 A | | 8/2017 | |
| JP | 2002182580 A | | 6/2002 | |
| JP | 2008053250 A | * | 3/2008 | ......... H01L 21/6835 |
| WO | 2017107097 A1 | | 6/2017 | |
| WO | 2018124664 A1 | | 7/2018 | |

\* cited by examiner

Separating First and Second Substrates

METHODS AND DISPLAY DEVICES FOR MICRO-LED MASS TRANSFER PROCESSES

CROSS REFERENCE TO RELATED APPLICATION

This application claims benefits of Chinese Patent Applications No. 201810743952.0, filed on Jul. 9, 2018 in the State Intellectual Property Office of China, the disclosure of which is incorporated herein by reference in its entirety.

TECHNICAL FIELD

The present disclosure relates to display technology, particularly to methods and apparatuses for mass transfer process in manufacturing micro light emitting diode (LED).

BACKGROUND ART

Micro-LED has developed into one of the hot spots of future display technology, but its technical difficulties and technical complexity, especially its key technology: massive transfer process. With the development of technology, the development of massive transfer process has produced many technical branches, such as electrostatic adsorption, laser burning, and so on.

The traditional method of transferring a large number of micro LEDs is to transfer the micro-components from the transfer substrate to the receiving substrate by wafer bonding. One of the implementation methods of the transfer method is "direct transfer," that is, the micro-array array is directly bonded from the transfer substrate to the receiving substrate, and then the transfer substrate is removed. Another implementation method is "indirect transfer." This method involves two steps of joining/stripping. In the indirect transfer, the transposition head picks up a portion of the micro-element array on the intermediate carrier substrate, then bonds the micro-element array to the receiving substrate, and then removes the transposition head.

However, the current mass transfer processes, whether direct transfer or indirect transfer, are relatively complicated in process and their cost are very high.

SUMMARY

Therefore, the present disclosure provides a method for Micro-LED mass transfer, a method for manufacturing Micro-LED display devices, and Micro-LED display devices.

To solve the above challenges in mass transfer, following technical solutions are provided in the present disclosure.

According to one aspect of the present disclosure, there is provided a Micro-LED mass transfer method which divides the micro devices on the Micro-LED array into a first plurality of micro devices and a second plurality of micro devices. In addition, each micro device includes oppositely disposed first and second surfaces, where first surfaces of the first plurality of micro devices are bonded with a first transfer substrate, and second surfaces of the second plurality of micro devices are bonded with a second transfer substrate. Therefore, mass transfer is implemented by separately bonding the two surfaces with the two transfer substrates and then separating the two pluralities of micro devices only for once. This method simplifies the mass transfer process and reduces the cost because it requires no complex process of separating and no additional process after mass transfer.

According to a second aspect of the present disclosure, there is provided a method for manufacturing Micro-LED display devices, which adopts the method above for Micro-LED mass transfer as its mass transfer process. This method also simplifies the process and reduces the cost.

According to a third aspect of the present disclosure, there is provided a display device for Micro-LED which adopts the method above for manufacturing the Micro-LED display device. This implementation also simplifies the process and reduces the cost.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate examples consistent with the invention and, together with the description, serve to explain the principles of the disclosure.

The above drawings and the following descriptions are only examples of the present disclosure. For those skilled in the art, other drawings may be obtained according to these drawings without creative effort.

DETAILED DESCRIPTION

Hereinafter, aspects of the present disclosure will be described in conjunction with the accompanying drawings, rather than to limit the present disclosure. Variations of structure, method, or functional made by the ordinary skilled in the art based on these examples are all contained in the scope of the present disclosure.

The terms used in present disclosure are merely directed to illustrate the particular examples, rather than limit to the present disclosure. The singular forms "a" "an" and "the" as used in the present disclosure as well as the appended claims also refer to plural forms unless other meanings are definitely contained in the context. It should be appreciated that the term "and/or" as used herein refers to any or all possible combination of one or more associated listed items.

The technical solutions as provided in the present disclosure may include the following advantages: the wheel reversing mechanism of the present disclosure can be unlocked by the locking mechanism, and then the wheel assembly can be reversed by the actuator through the linkage assembly while the cart frame is folded, such that the wheel assembly is folded conveniently, and thus occupies smaller space after being folded.

Some examples of the present disclosure will be described in detail with reference to the accompanying drawings. In the case of no conflict, the following examples and the features in the examples may be combined with each other.

Figure 1:
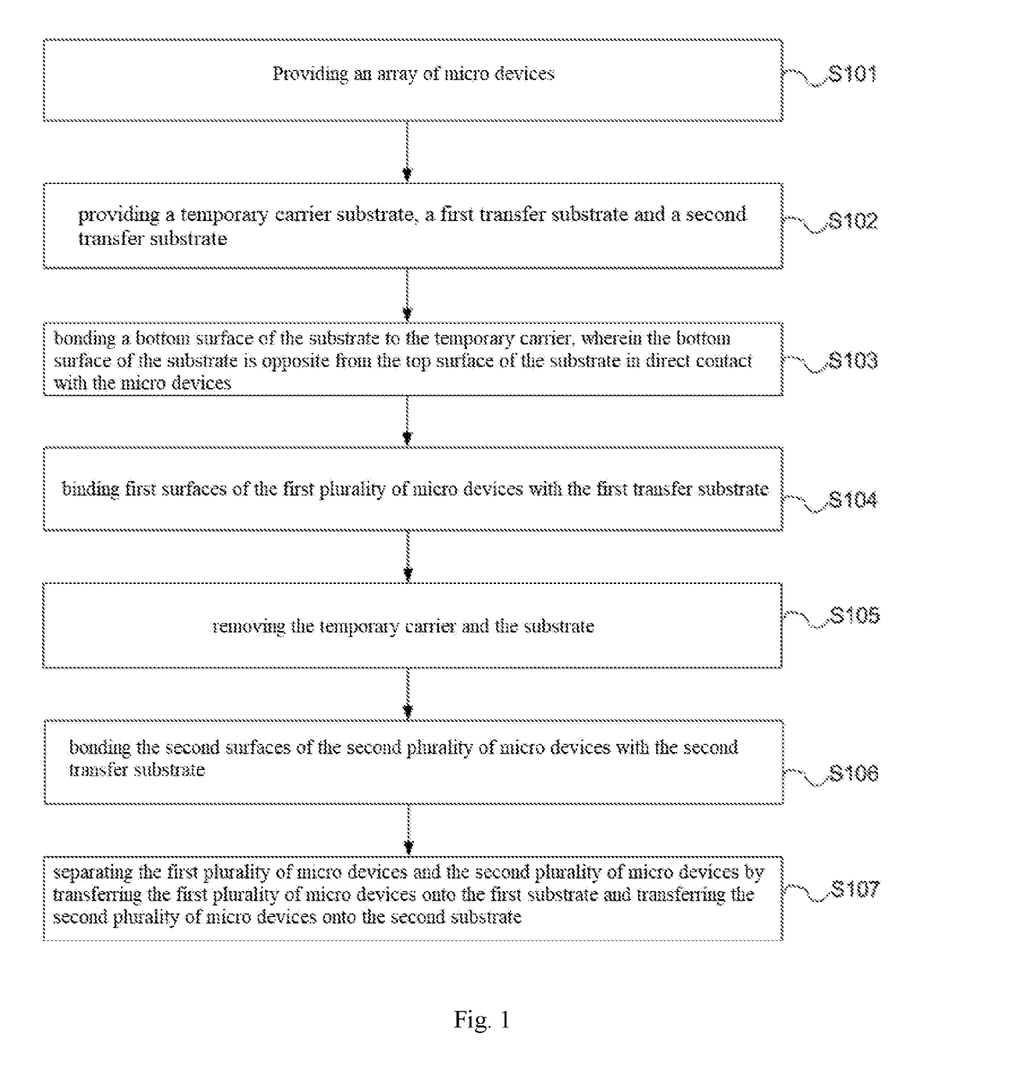
FIG. 1 is an example flow chart illustrating a Micro-LED mass transfer method according to an aspect of the present disclosure.

FIG. 1 is an example flow chart illustrating a Micro-LED mass transfer method. As shown in FIG. 1, the Micro-LED mass transfer method compromises the following steps:

S101: providing an array of micro devices arranged in an array on a top surface of a substrate, each micro device comprising oppositely disposed first and second surfaces, the second surface is directly disposed on the top surface substrate, and the array of micro devices include a first plurality of micro devices and a second plurality of micro devices.

In one or more examples, the method for forming an array of micro devices may include forming multiple separate micro devices, and then disposing the micro devices on the substrate. Alternatively or additionally, the substrate may include a blue film. The blue film may be used for initial bonding with multiple micro devices. And in the subsequent process, the blue film can be quickly removed by peeling or other removing solutions.

In one or more examples, micro devices include micro LED chips having ipsilateral electrodes where P- and N-electrodes are on the same side of the substrate. Alternatively or additionally, micro devices include micro LED chips having contralateral electrodes where P- and N-electrodes are on the different side of the substrate. In the subsequent process, the bonding material that bonds the micro devices with the first and second transfer substrates is adhesive glue, which can planarize the surfaces of micro devices. Therefore, there is no need for any special structure to select or transfer the micro devices in this disclosure.

Figure 2:
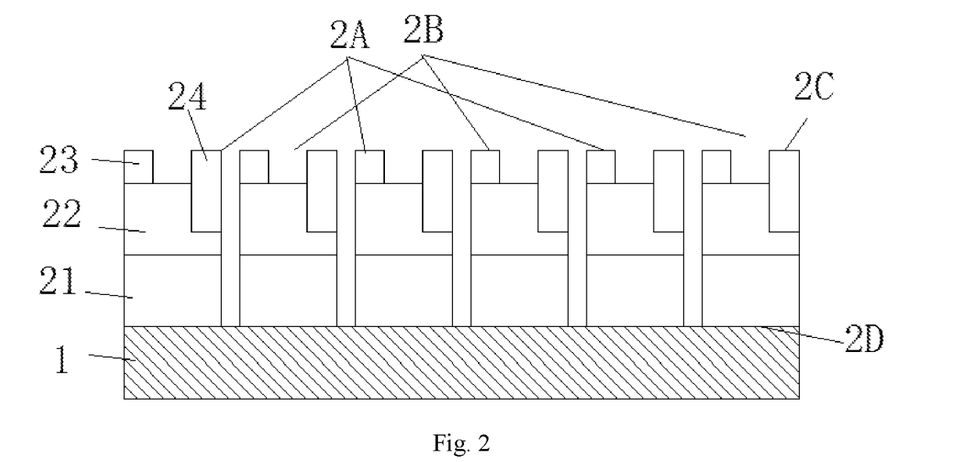
FIG. 2 illustrates a schematic view corresponding to the structure of an array of micro devices according to an aspect of the present disclosure.

Alternatively or additionally, the example of ipsilateral electrodes is illustrated in this example. FIG. 2 illustrates the structure of an array of micro devices comprising a substrate 1 and micro devices on a surface of the substrate 1. A micro device includes a substrate 21, an epitaxial structure 22 which is on the surface of the substrate 21 and the surface faces away from the substrate 1, and a first electrode 23 and a second electrode 24 which are on the surface of the epitaxial structure 22 and the surface faces away from the substrate 21. The multiple micro devices include oppositely disposed first surface 2C and second surface 2D. The second surface 2D is disposed on the top surface substrate 1. And the multiple micro devices include a first plurality 2A and a second plurality 2B. In this example, the illustration of the first plurality 2A and the second plurality 2B does not proscribe a limit to the division of micro devices. And the first plurality 2A and the second plurality 2B can be divided based on the practical requirement.

It should be noted that, this example does not proscribe a limit to the structure of epitaxial structure 22. The epitaxial structure 22 compromises a N type semiconductor layer, a P type semiconductor layer, and an active layer which is between the N type semiconductor layer and the P type semiconductor layer. The active layer includes multiple quantum well layer and other structures. Alternatively or additionally, the material of the N type semiconductor layer and the P type semiconductor layer includes GaAs, GaP, GaN, SiC, AlGaN, and so on.

In some examples, the N type semiconductor layer, the active layer and the P type semiconductor layer are disposed in the order that faces away from the substrate 21, or toward the substrate 21. Alternatively or additionally, the order that faces away from the substrate 21 can be sequentially N type semiconductor layer, the active layer and the P type semiconductor layer. In addition, a transparent conductive layer for extending current is disposed on the surface of the P type semiconductor layer that faces away from the substrate 21. In addition, the first electrode 23 includes P type electrode and the second electrode 24 includes N type electrode.

S102: providing a temporary carrier substrate, a first transfer substrate and a second transfer substrate.

Here, the temporary carrier substrate provides temporary support for the array of micro devices. This example does not proscribe limit to the material of the temporary substrate.

Moreover, the first and the second transfer substrates provide support for the micro devices after mass transfer. And this example does not proscribe limit to the material of the first and second transfer substrates. The materials of the first and second transfer substrates may be the same, or may be different. And the materials are selected based on the function of the micro devices after mass transfer. In this example, the materials of the first and second transfer substrates are the same.

S103: bonding a bottom surface of the substrate to the temporary carrier substrate, where the bottom surface of the substrate is opposite from the top surface of the substrate in direct contact with the micro devices.

Figure 3:
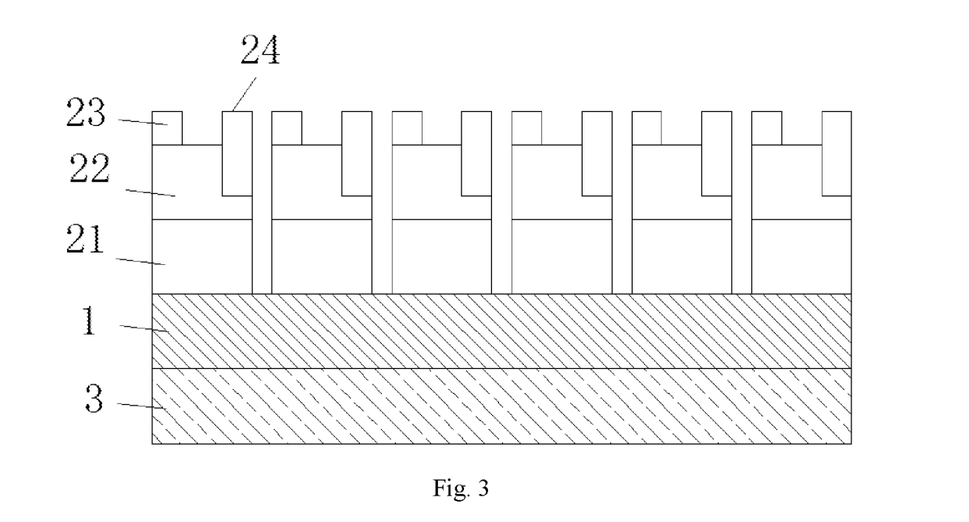
FIG. 3 illustrates a schematic view corresponding to the structure of array of micro devices after a step in the method for manufacturing Micro-LED display devices according to an aspect of the present disclosure.

As shown in FIG. 3, the bottom surface of the substrate 1 is bonded to the temporary carrier substrate 3, where the bottom surface of the substrate 1 is opposite from the top surface of the substrate in direct contact with the micro devices. This example does not proscribe limit to the bonding solutions between the substrate 1 and the temporary carrier substrate 3. Alternatively or additionally, the substrate 1 is bonded to the temporary carrier substrate 3 by an adhesive glue or a photoresist.

S104: bonding first surfaces of the first plurality of micro devices with the first transfer substrate. For example, the first surfaces of the first plurality of micro devices may be bound or secured with the first transfer substrate.

It should be noted that, this example does not proscribe limit to the bonding solutions between the first surfaces of the first plurality of micro devices and the first transfer substrate. Alternatively or additionally, the first surfaces of the first plurality of micro devices are bonded with the first transfer substrate by using a first type of bonding material.

Specifically, this example discloses the step of protecting the surfaces of the second plurality of the micro devices that are not bonded with the first transfer substrate, and then bonding the first surfaces of the first plurality of micro devices with the first transfer substrate.

Alternatively or additionally, this example discloses the step of covering first surfaces of the second plurality of micro devices with a protective layer, covering the protective layer and first surfaces of the first plurality of micro devices with a first type of bonding material, and positioning the first transfer substrate on the bonding surface of the first type of bonding material, where the bonding surface facing away from the micro devices. Alternatively or additionally, the first type of bonding material includes adhesive glue or photoresist.

This example does not proscribe limit to the material of the protective layer. Generally, the protective layer is to temporarily cover the second plurality of micro devices so that they will not be bonded with the first type of bonding material. In addition, the protective layer is to subsequently separate the second plurality of micro devices from the first transfer substrate. Alternatively or additionally, the protective layer includes a second type of bonding material and the removal solution for the second type of bonding material is different from the removal solution for the first type of bonding material. That is, when the second type of bonding material is removed by using chemical corrosion, the first type of bonding material is not affected and not removed. Alternatively or additionally, the first type of bonding material is adhesive glue, and the second type of bonding material is a photoresist.

Figure 4:
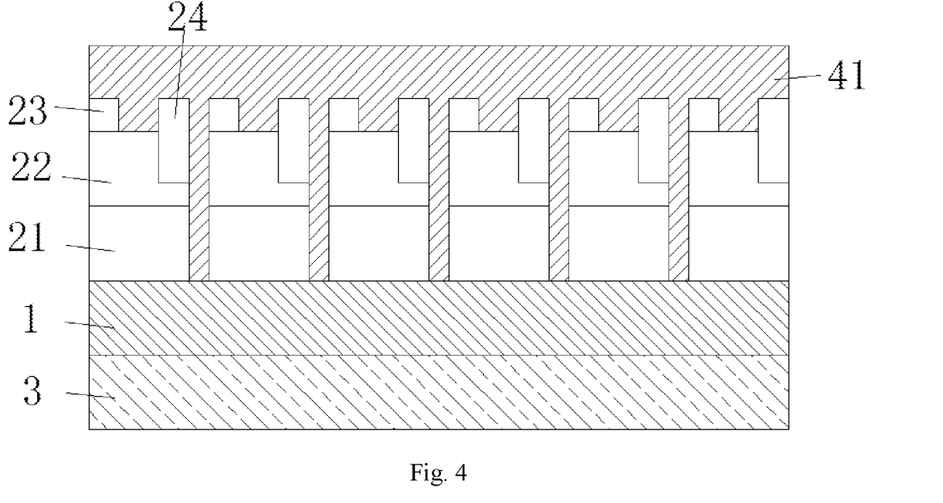
FIG. 4 illustrates a schematic view corresponding to the structure of array of micro devices after a step in the method for manufacturing Micro-LED display devices according to an aspect of the present disclosure.
Figure 5:
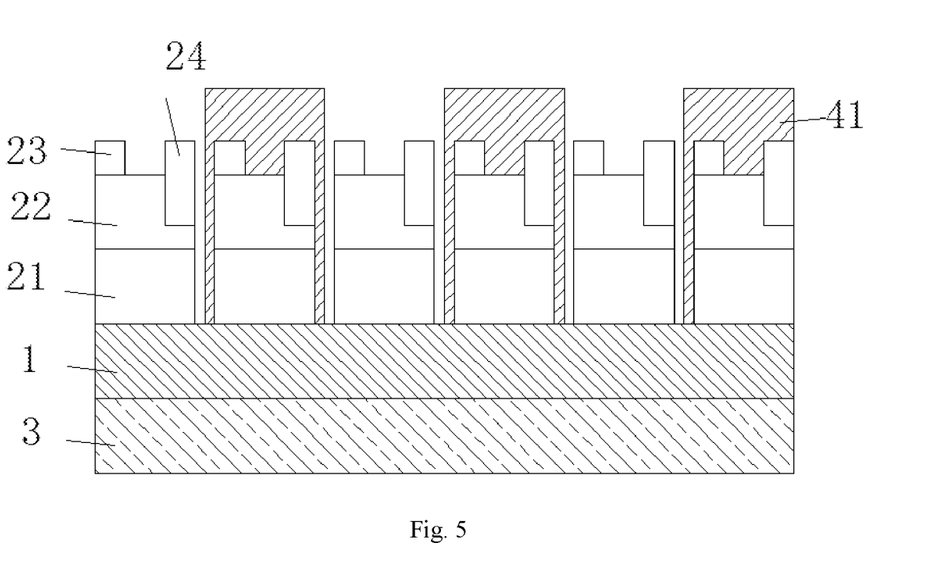
FIG. 5 illustrates a schematic view corresponding to the structure of array of micro devices after a step in the method for manufacturing Micro-LED display devices according to an aspect of the present disclosure.

FIG. 4 discloses the step of covering photoresists 41 on the first surfaces of all the micro devices, and then the photoresists is removed from the first surfaces of the first plurality of micro devices. Here, as shown in FIG. 5, the photoresists remain on the first surfaces of the second plurality of the micro devices and on the area between two adjacent micro devices.

Figure 6:
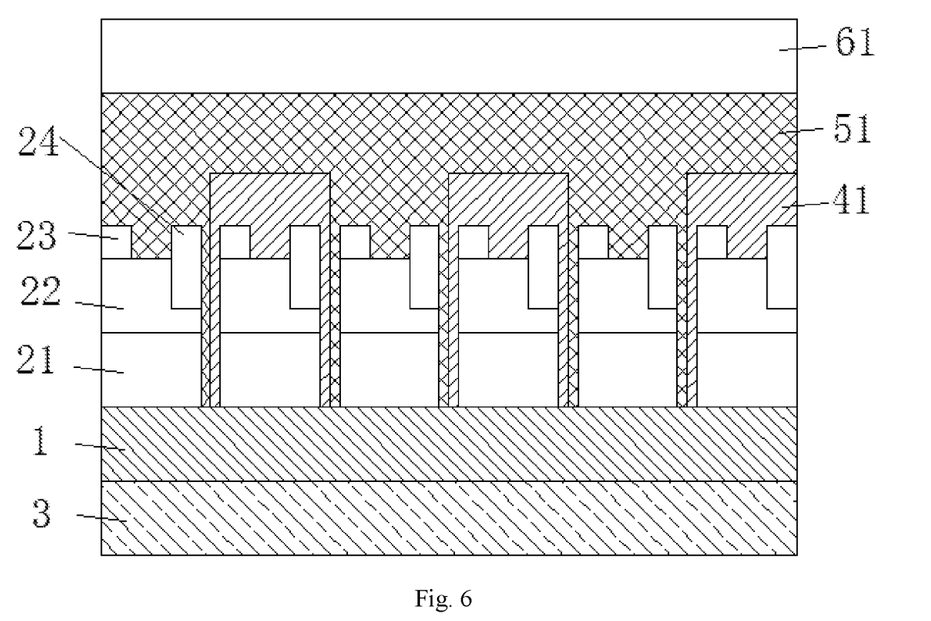
FIG. 6 illustrates a schematic view corresponding to the structure of array of micro devices after a step in the method for manufacturing Micro-LED display devices according to an aspect of the present disclosure.

FIG. 6 discloses the step of covering adhesive glue 51 on the photoresists 41 and the first plurality of micro devices that are not covered by photoresists. And then the first transfer substrate 61 is bonded with the first surfaces of the first plurality of micro devices on the array by adhesive glue 51.

It should be noted that, this example does not proscribe limit to the material of adhesive glue 51. Here, the material of the adhesive glue 51 includes any material that has adhesion and has different corrosion solution from photoresists 41.

S105: removing the temporary carrier substrate and the substrate.

Figure 7:
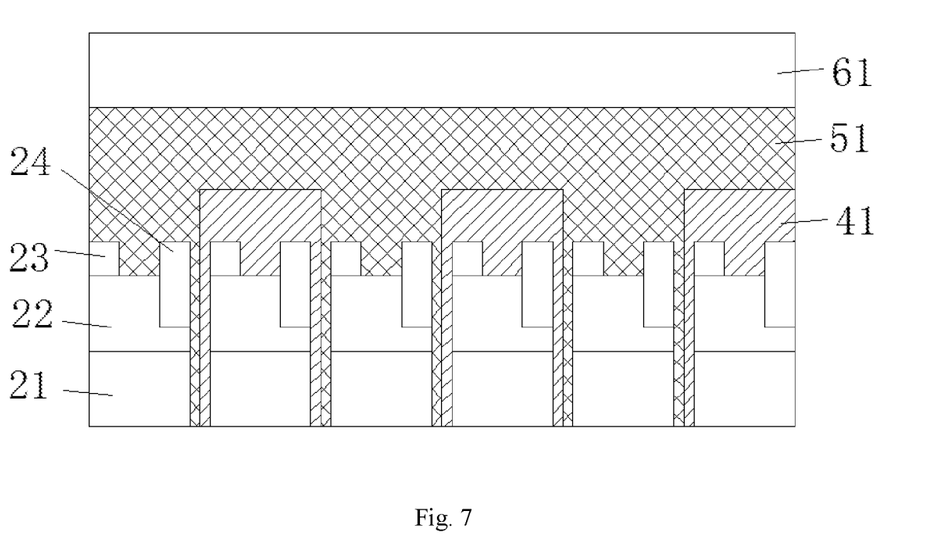
FIG. 7 illustrates a schematic view corresponding to the structure of array of micro devices after a step in the method for manufacturing Micro-LED display devices according to an aspect of the present disclosure.

FIG. 7 shows the structure for removing the temporary carrier substrate and the substrate. The temporary carrier substrate 3 and the substrate 1 can be removed because the first transfer substrate 61 provides support for the array of micro devices where the first surfaces of the first plurality of micro devices are bonded with the first transfer substrate 61 by using adhesive glue 51 and the first surfaces of the second plurality of micro devices are bonded with the first transfer substrate 61 by using photoresists 41 and adhesive glue 51. Alternatively or additionally, the substrate includes a blue film.

It should be noted that, the second surfaces of the second plurality of micro devices will subsequently bond with the second transfer substrate. Therefore, this example additionally includes the cleaned second surfaces of micro devices which will be bond with a second transfer substrate.

S106: bonding the second surfaces of the second plurality of micro devices with the second transfer substrate.

It should be noted that, this example does not proscribe limit to the bonding solution between the second surfaces of the second plurality of micro devices and the second transfer substrate. Alternatively or additionally, the second surfaces of the second plurality of micro devices are bond with the second transfer substrate by using the first type of bonding material.

Specifically, this example discloses the step of protecting the surfaces of the first plurality of micro devices that are not bonding with the second transfer substrate, and then bonding the second surfaces of the second plurality of micro devices with the second transfer substrate.

Alternatively or additionally, this example discloses the step of covering a protective layer on the second surfaces of the first plurality of micro devices, covering the first type of bonding material on the protective layer and the second surface of the second plurality of the micro devices, and positioning the second transfer substrate on a bonding surfacing of the first type of bonding material facing away from the micro devices.

This example does not proscribe limit to the material of the protective layer. Generally, the protective layer is to temporarily cover the first plurality of micro devices so that they will not be bonded with the adhesive glue. In addition, the protective layer is to subsequently separate the first plurality of micro devices from the second transfer substrate. Alternatively or additionally, the protective layer includes a second type of bonding material and the removal solution for the second type of bonding material is different from the removal solution for the first type of bonding material. Alternatively or additionally, the first type of bonding material is adhesive glue, and the second type of bonding material is a photoresist.

Figure 8:
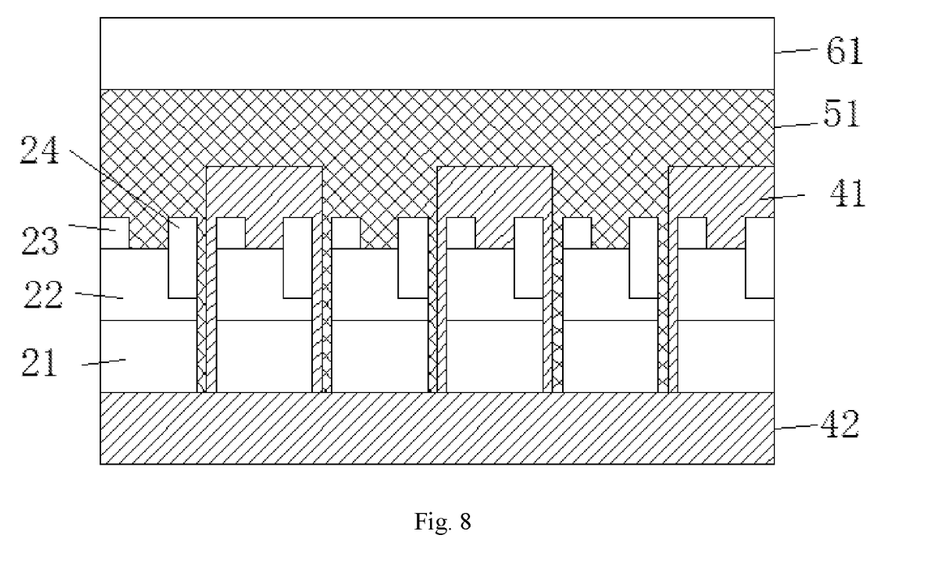
FIG. 8 illustrates a schematic view corresponding to the structure of array of micro devices after a step in the method for manufacturing Micro-LED display devices according to an aspect of the present disclosure.
Figure 9:
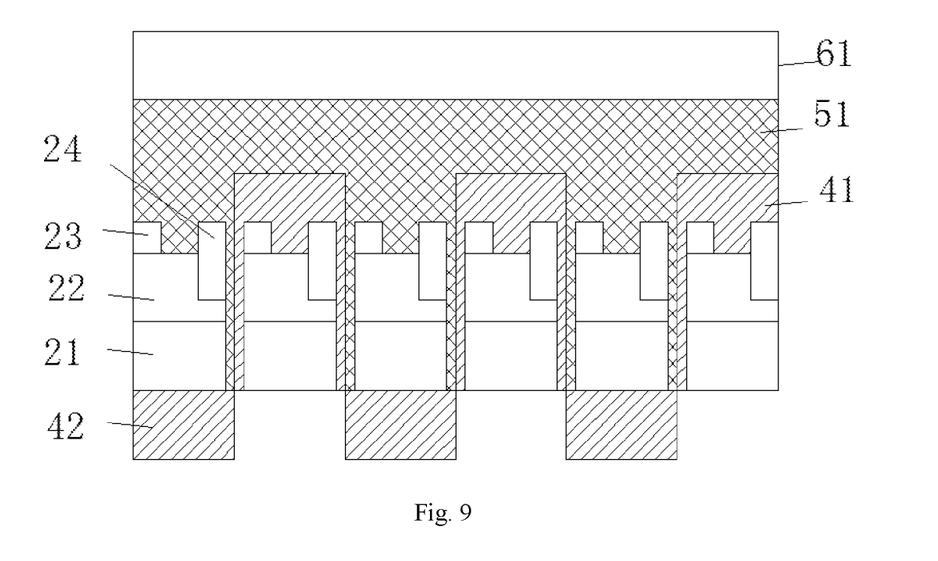
FIG. 9 illustrates a schematic view corresponding to the structure of array of micro devices after a step in the method for manufacturing Micro-LED display devices according to an aspect of the present disclosure.

FIG. 8 discloses the step of covering photoresists 42 on the second surfaces of all the micro devices, and then the photoresists are removed from the second surfaces of the second plurality of the micro devices. Here, the photoresists remain on the second surfaces of the first plurality of the micro devices.

Figure 10:
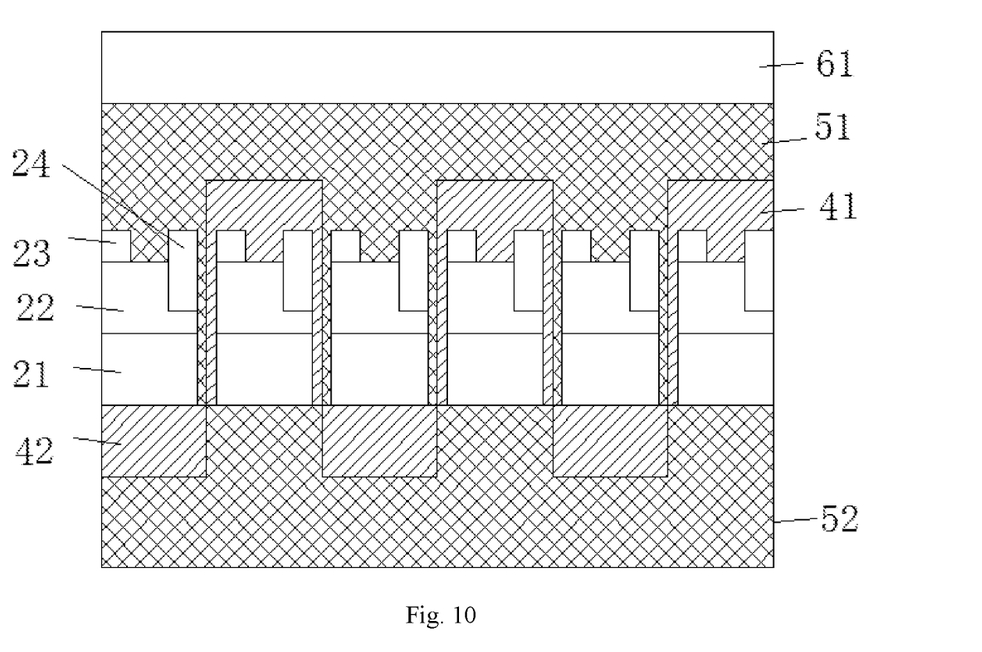
FIG. 10 illustrates a schematic view corresponding to the structure of array of micro devices after a step in the method for manufacturing Micro-LED display devices according to an aspect of the present disclosure.
Figure 11:
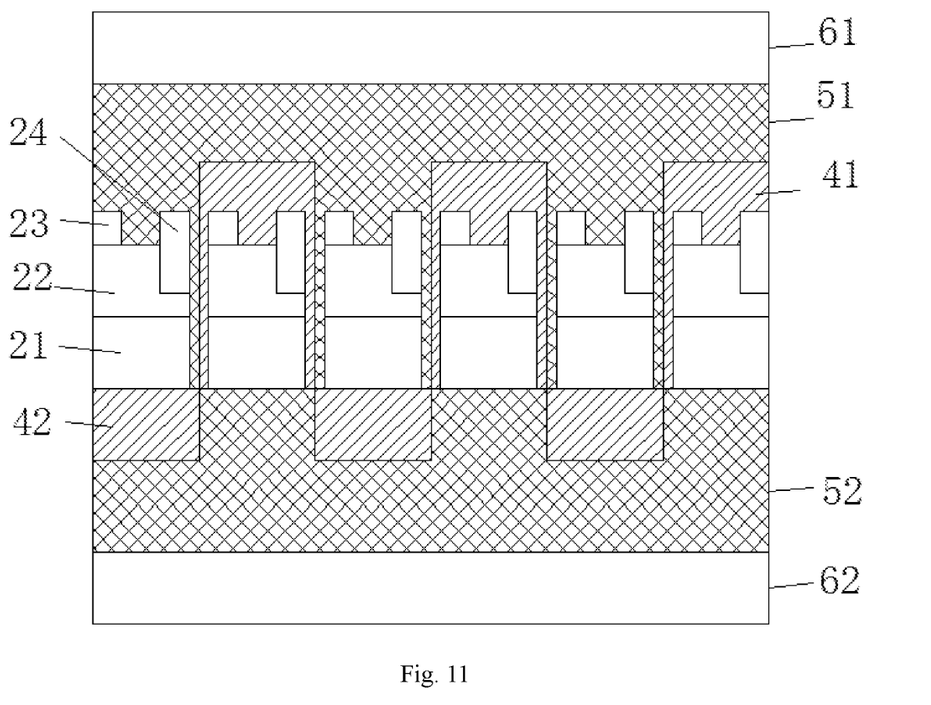
FIG. 11 illustrates a schematic view corresponding to the structure of array of micro devices after a step in the method for manufacturing Micro-LED display devices according to an aspect of the present disclosure.

FIG. 10 discloses the step of covering adhesive glue 52 on the photoresists 42 and the second plurality of micro devices that are not covered by photoresists 42. And then, as shown in FIG. 11, the second transfer substrate 62 is bonded with the second surfaces of the second plurality of micro devices on the array.

It should be noted that, the present disclosure does not limit the type of adhesive material in the glue 52. Here, the adhesive material of the glue 52 may include any material that has adhesion and has different corrosion solution from photoresists 42.

S107: separating the first plurality of micro devices and the second plurality of micro devices by transferring the first plurality of micro devices onto the first substrate and transferring the second plurality of micro devices onto the second substrate. This step may include following acts: separating the first plurality of micro devices and the second plurality of micro devices by transferring the first plurality of micro devices onto the first transfer substrate; bonding the second surfaces of the second plurality of micro devices to a second transfer substrate; and transferring the second plurality of micro devices onto the second transfer substrate.

Figure 12:
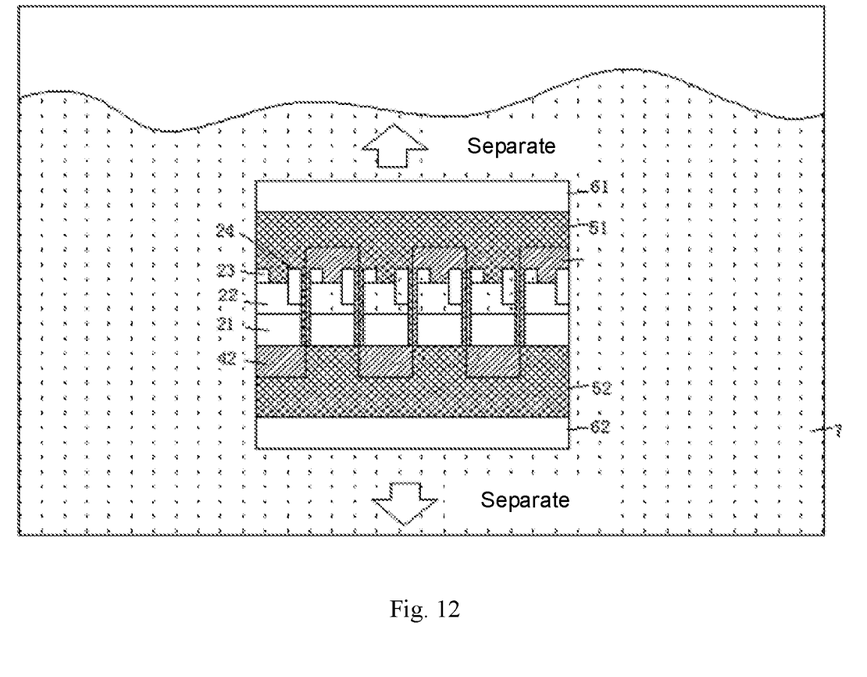
FIG. 12 illustrates a schematic view corresponding to the structure of array of micro devices after a step in the method for manufacturing Micro-LED display devices according to an aspect of the present disclosure.
Figure 13:
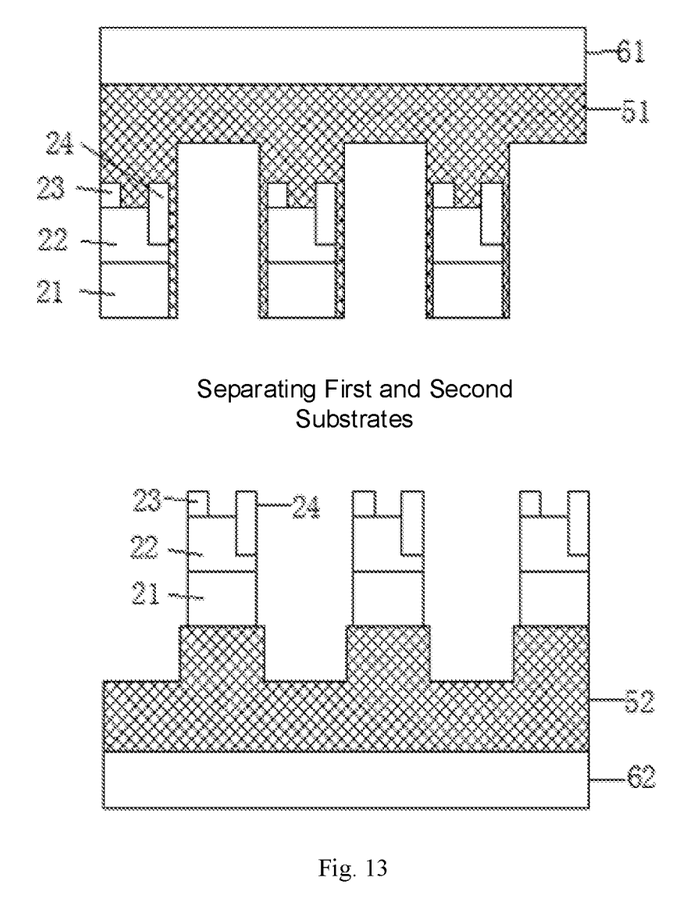
FIG. 13 illustrates a schematic view corresponding to the structure of array of micro devices after a step in the method for manufacturing Micro-LED display devices according to an aspect of the present disclosure.

For example, the first plurality of micro devices are separated from the second plurality of micro devices. Alternatively or additionally, as shown in FIG. 12, the micro devices that bond with the first transfer substrate 61 and the second transfer substrate 62 are disposed into removal solution 7. The removal solution 7 removes photoresists 41 and photoresists 42 and remains adhesive glue 51 and adhesive glue 52. As shown in FIG. 13, the first plurality of micro devices are transferred onto the first substrate 61, and the second plurality of micro devices are transferred onto the second substrate 62.

Here, the removal solution removes photoresists, but does not remove adhesive glue.

The present disclosure provides Micro-LED mass transfer method which requires no additional and complex tools such as the laser and the vacuum holder. The present disclosure simplifies the implementation and reduces the cost, especially where the temporary carrier substrate can be repeatedly utilized.

According to a second aspect of the present disclosure, there is provided a method for manufacturing Micro-LED display devices, which adopts the method above for Micro-LED mass transfer as its mass transfer process. This method also simplifies the process and reduces the cost.

Figure 14:
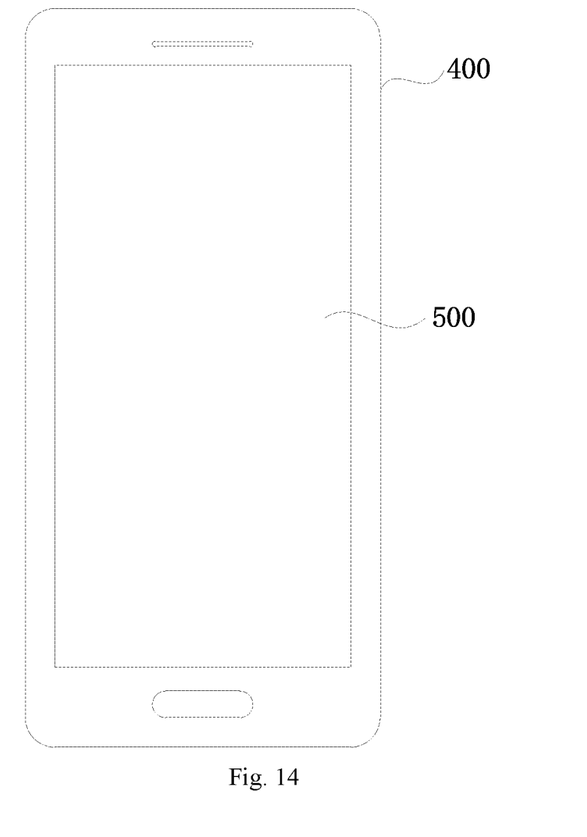
FIG. 14 is a schematic structural diagram of a Micro-LED display device according to an aspect of the present disclosure.

According to a third aspect of the present disclosure, there is provided a Micro-LED display device. The Micro-LED display device includes a displayer. FIG. 14 is a schematic structural diagram of the Micro-LED display device. As shown in FIG. 14, the Micro-LED display device 400 includes a Micro-LED displayer 500, which is manufactured by the mass transfer method above. For example, the Micro-LED display device 400 may be a cell phone as shown in FIG. 14, a computer, a TV set, or a smart wearable display device.

Other examples of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact examples described above and illustrated in the accompanying drawings, and that various modifications and changes can be made without departing from the scope thereof. It is intended that the scope of the invention only be limited by the appended claims.

What is claimed is:

1. A method for mass transfer, comprising:
    providing micro devices arranged in an array on a top surface of a substrate, wherein each micro device comprises a first surface and a second surface that are oppositely disposed, the second surface is directly disposed on the top surface of the substrate, and the micro devices include a first plurality of micro devices and a second plurality of micro devices;
    providing a temporary carrier substrate and a first transfer substrate;
    bonding a bottom surface of the substrate to the temporary carrier substrate, wherein the bottom surface of the substrate is opposite from the top surface of the substrate in direct contact with the micro devices;
    bonding first surfaces of the first plurality of micro devices with the first transfer substrate;
    removing the temporary carrier substrate and the substrate;
    separating the first plurality of micro devices from the second plurality of micro devices by transferring the first plurality of micro devices onto the first transfer substrate;
    bonding second surfaces of the second plurality of micro devices to a second transfer substrate; and
    transferring the second plurality of micro devices onto the second transfer substrate.

2. The method according to claim 1, wherein the micro devices comprise micro light emitting diode (LED) with each dimension between 1 μm to 100 μm.

3. The method according to claim 1, wherein two adjacent micro devices in each row of the micro devices arranged in the array comprises one micro device in the first plurality of micro devices and one micro device in the second plurality of micro devices.

4. The method according to claim 1, wherein bonding the first surfaces of the first plurality of micro devices with the first transfer substrate comprises:
    bonding the first surfaces of the first plurality of micro devices with the first transfer substrate by using a first bonding material.

5. The method according to claim 4, wherein bonding the first surfaces of the first plurality of micro devices with the first transfer substrate by using the first bonding material comprises:
    covering first surfaces of the second plurality of micro devices with a protective layer;
    covering the first bonding material on the first surfaces of the first plurality of micro devices and the protective layer; and
    positioning the first transfer substrate on a bonding surface of the first bonding material, the bonding surface facing away from the micro devices.

6. The method according to claim 5, wherein the protective layer comprises a second bonding material that is different adhesively from the first bonding material; and
    wherein, when the second bonding material is removed by using a removal solution, the first bonding material is not removed.

7. The method according to claim 6, wherein covering the first surfaces of the second plurality of micro devices with the protective layer comprises:
    covering first surfaces of all micro devices arranged in the array with the second bonding material; and
    removing the second bonding material covered on the first plurality of micro devices by a photolithography process.

8. The method according to claim 6, wherein the first bonding material is an adhesive glue, and the second bonding material is a photoresist.

9. The method according to claim 6, wherein bonding the second surfaces of the second plurality of micro devices to the second transfer substrate comprises:
    bonding the second surfaces of the second plurality of micro devices with the second transfer substrate by using the first bonding material.

10. The method according to claim 6, wherein bonding the second surfaces of the second plurality of micro devices with the second transfer substrate by using the first bonding material comprises:
- covering second surfaces of the first plurality of micro devices with a second protective layer;
- covering the second surfaces of the second plurality of micro devices and the second protective layer with the first bonding material; and
- positioning the second transfer substrate on the bonding surface of the first bonding material, the bonding surface facing away from the micro devices.

11. The method according to claim 10, wherein the second protective layer comprises the second bonding material that is adhesively different from the first bonding material; and
- wherein, when the second bonding material is removed by using a removal solution, the first bonding material is not removed.

12. The method according to claim 11, wherein covering the second surfaces of the first plurality of micro devices with the second protective layer comprises:
- covering second surfaces of all micro devices arranged in the array with the second bonding material; and
- removing the second bonding material covered on the second plurality of micro devices by a second photolithography process.

13. The method according to claim 12, wherein the first bonding material is an adhesive glue, and the second bonding material is a photoresist.

14. The method according to claim 6, further comprising:
- placing the micro devices arranged in the array bonded with the first transfer substrate and the second transfer substrate in the removal solution; and
- removing the second bonding material with the removal solution, leaving the first bonding material, so that the first plurality of micro devices are transferred onto the first transfer substrate while the second plurality of micro devices are transferred onto the second transfer substrate.

15. The method according to claim 1, wherein the micro devices comprise micro light emitting diode (LED) chips having ipsilateral electrodes.

16. The method according to claim 6, wherein the substrate comprises a blue film.

17. A method for mass transfer, comprising:
- providing micro devices arranged in an array on a top surface of a substrate, wherein each micro device comprises a first surface and a second surface that are oppositely disposed, the second surface is directly disposed on the top surface of the substrate, and the micro devices arranged in the array include a first plurality of micro devices and a second plurality of micro devices;
- bonding a bottom surface of the substrate to a temporary carrier substrate, wherein the bottom surface of the substrate is opposite from the top surface of the substrate in direct contact with the micro devices;
- bonding first surfaces of the first plurality of micro devices with a first transfer substrate;
- removing the temporary carrier substrate and the substrate;
- bonding second surfaces of the second plurality of micro devices to a second transfer substrate; and
- separating the first plurality of micro devices from the second plurality of micro devices by transferring the first plurality of micro devices onto the first transfer substrate while transferring the second plurality of micro devices onto the second transfer substrate.

18. The method according to claim 17, wherein the micro devices comprise micro light emitting diode (LED) chips having ipsilateral electrodes.

19. The method according to claim 17, wherein the substrate comprises a blue film.

* * * * *